(12) United States Patent
Sun

(10) Patent No.: US 10,841,711 B2
(45) Date of Patent: Nov. 17, 2020

(54) MEMS MICROPHONE AND METHOD OF MANUFACTURING THE SAME

(71) Applicant: DB HITEK CO., LTD., Seoul (KR)

(72) Inventor: Jong Won Sun, Icheon-si (KR)

(73) Assignee: DB HITEK CO., LTD, Seoul (KR)

( * ) Notice: Subject to any disclaimer, the term of this patent is extended or adjusted under 35 U.S.C. 154(b) by 0 days.

(21) Appl. No.: 16/506,607

(22) Filed: Jul. 9, 2019

(65) Prior Publication Data

US 2020/0021920 A1 Jan. 16, 2020

(30) Foreign Application Priority Data

Jul. 10, 2018 (KR) ........................ 10-2018-0080045

(51) Int. Cl.
| | |
|---|---|
| *H04R 31/00* | (2006.01) |
| *B81B 3/00* | (2006.01) |
| *H04R 19/04* | (2006.01) |
| *H04R 7/04* | (2006.01) |
| *B81C 1/00* | (2006.01) |
| *H04R 7/18* | (2006.01) |

(52) U.S. Cl.
CPC ............ *H04R 19/04* (2013.01); *B81B 3/001* (2013.01); *B81B 3/0054* (2013.01); *B81C 1/00039* (2013.01); *B81C 1/00968* (2013.01); *H04R 7/04* (2013.01); *H04R 7/18* (2013.01); *H04R 31/003* (2013.01); *B81B 2201/0257* (2013.01); *B81B 2203/0127* (2013.01); *B81B 2203/0307* (2013.01); *B81C 2201/013* (2013.01); *B81C 2201/0105* (2013.01); *B81C 2201/115* (2013.01); *H04R 2201/003* (2013.01)

(58) Field of Classification Search
CPC .... B81C 1/00968; H04R 7/10; H04R 19/005; H04R 19/04; H04R 31/003; H04R 2201/003
See application file for complete search history.

(56) References Cited

U.S. PATENT DOCUMENTS

| | | | |
|---|---|---|---|
| 8,643,129 B2 * | 2/2014 | Laming | H04R 7/18 |
| | | | 257/419 |
| 8,975,107 B2 * | 3/2015 | Dehe | H04R 19/04 |
| | | | 438/53 |
| 9,584,889 B2 * | 2/2017 | Escher-Poeppel | H04R 1/021 |
| 2017/0311083 A1 | 10/2017 | Sun et al. | |
| 2017/0311088 A1 | 10/2017 | Sun et al. | |
| 2017/0311089 A1 | 10/2017 | Sun et al. | |

(Continued)

*Primary Examiner* — Brian Ensey
(74) *Attorney, Agent, or Firm* — Patterson Thuente Pedersen, P.A.

(57) ABSTRACT

A MEMS microphone includes a substrate defining a cavity, a diaphragm being spaced apart from the substrate, covering the cavity, and configured to generate a displacement of the diaphragm in response to an applied acoustic pressure, an anchor extending from an end portion of the diaphragm, and fixed to an upper surface of the substrate to support the diaphragm and a back plate disposed over the diaphragm, the back plate being spaced apart from the diaphragm such that an air gap is maintained between the back plate and the diaphragm, and defining a plurality of acoustic holes, wherein the anchor has a repetitive concave-convex shape in a direction toward a center of the diaphragm so that the anchor acts as a resistance to an acoustic wave.

20 Claims, 10 Drawing Sheets

(56) References Cited

U.S. PATENT DOCUMENTS

| | | |
|---|---|---|
| 2017/0359648 A1 | 12/2017 | Park et al. |
| 2019/0047849 A1 | 2/2019 | Park et al. |
| 2019/0052976 A1 | 2/2019 | Sun |
| 2019/0082269 A1 | 3/2019 | Sun |
| 2019/0082270 A1 | 3/2019 | Sun |
| 2019/0082271 A1 | 3/2019 | Kim et al. |

\* cited by examiner

MEMS MICROPHONE AND METHOD OF MANUFACTURING THE SAME

CROSS-REFERENCE TO RELATED APPLICATION

This application claims priority to Korean Patent Application No. 10-2018-0080045, filed on Jul. 10, 2018 and all the benefits accruing therefrom under 35 U.S.C. § 119, the contents of which are incorporated by reference in their entirety.

TECHNICAL FIELD

The present disclosure relates to Micro-Electro-Mechanical Systems (MEMS) microphones capable of converting an acoustic wave into an electrical signal, and a method of manufacturing such MEMS microphones, and more particularly, to capacitive MEMS microphones that are capable of transmitting signals related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

A MEMS microphone may include a substrate including a cavity, a bendable diaphragm and a back plate which is facing the diaphragm. The diaphragm is spaced apart from the substrate and the back plate so that the diaphragm can be freely bent upwardly and downwardly. The diaphragm can be a membrane structure to generate a displacement due to an acoustic pressure. In particular, when the acoustic pressure reaches to the diaphragm, the diaphragm may be bent upwardly or downwardly due to the acoustic pressure. The displacement of the diaphragm can be sensed through a change of capacitance between the diaphragm and the back plate. As a result, an acoustic wave can be converted into an electrical signal for output.

In order to apply the MEMS microphone to a mobile device such as a mobile phone, signal-to-noise ratio (SNR) of the MEMS microphone must be improved. In order to improve the SNR, noise generated in acoustic holes formed in the back plate must be reduced. Therefore, a configuration is required that acts as a resistance for reducing the noise to acoustic waves passing through the acoustic holes of the back plate.

SUMMARY

The embodiments herein provide a MEMS microphone capable of reducing noise generated in acoustic holes of a back plate, and a method of manufacturing the MEMS microphone.

According to an example embodiment herein, a MEMS microphone includes a substrate defining a cavity, a diaphragm spaced apart from the substrate, covering the cavity, and configured to generate a displacement thereof in response to an applied acoustic pressure, an anchor extending from an end portion of the diaphragm and fixed to an upper surface of the substrate to support the diaphragm and a back plate disposed over the diaphragm, the back plate being spaced apart from the diaphragm such that an air gap is maintained between the back plate and the diaphragm, and defining a plurality of acoustic holes, wherein the anchor has a repetitive concave-convex vertically-sectional shape along a direction toward a center of the diaphragm so that the anchor acts as a resistance to an acoustic wave.

In an example embodiment, the anchor may include a plurality of contacting portions in contact with the upper surface of the substrate, spaced from each other, and presenting a ring shape having an inner diameter larger than the perimeter of the cavity.

In an example embodiment, the anchor may further include a connecting portion disposed between the contacting portions to connect the contacting portions to each other.

In an example embodiment, either of at least one of widths of the contacting portions or the width of the connecting portion may be adjusted to vary a resistance value of the anchor with respect to the acoustic wave.

In an example embodiment, the diaphragm may define a plurality of vent holes penetrating therethrough, and spaced apart from each other along an edge portion of the diaphragm.

In an example embodiment, the MEMS microphone may further include an upper insulation layer covering the back plate and holding the back plate to space the back plate from the diaphragm such that the air gap is maintained and a strut provided at an outer side of the anchor and having a lower surface in contact with the upper surface of the substrate to support the upper insulation layer away from the substrate such that the upper insulation layer is spaced apart from the diaphragm.

In an example embodiment, the upper insulation layer may have a corresponding portion located over the anchor and having a concave-convex shape similar to that of the anchor.

According to an example embodiment of the present invention, a MEMS microphone includes a substrate presenting a vibration area, a supporting area surrounding the vibration area and a peripheral area surrounding the supporting area, the substrate defining a cavity formed in the vibration area, a diaphragm disposed in the vibration area, being spaced apart from the substrate, covering the cavity, and configured to generate a displacement thereof in response to an applied acoustic pressure, an anchor extending from an end portion of the diaphragm in the supporting area, and being fixed to an upper surface of the substrate to support the diaphragm and a back plate disposed over the diaphragm in the vibration area, the back plate being spaced apart from the diaphragm such that an air gap is maintained between the back plate and the diaphragm, and defining a plurality of acoustic holes, wherein the anchor has a repetitive concave-convex vertically-sectional shape along a direction toward a center of the diaphragm so that the anchor acts as a resistance to an acoustic wave.

In an example embodiment, the anchor may include a plurality of contacting portions in contact with the upper surface of the substrate, spaced from each other, and presenting a ring shape having an inner diameter larger than the perimeter of the cavity and a connecting portion disposed between the contacting portions to connect the contacting portions to each other.

In an example embodiment, ether at least one of widths of the contacting portions or the width of the connecting portion may be adjusted to vary a resistance value of the anchor with respect to the acoustic wave.

In an example embodiment, the diaphragm may define a plurality of vent holes penetrating therethrough, spaced apart from each other along an edge portion of the diaphragm and located in the vibration area.

In an example embodiment, the MEMS microphone may further include an upper insulation layer covering the back plate and holding the back plate to space the back plate from the diaphragm such that the air gap is maintained and a strut disposed in the supporting area and having a lower surface in contact with the upper surface of the substrate to support the upper insulation layer away from the substrate such that the upper insulation layer is spaced apart from the diaphragm.

In an example embodiment, the upper insulation layer may have a corresponding portion located over the anchor and having a concave-convex shape similar to that of the anchor.

According to an example embodiment of the present invention, a method of manufacturing a MEMS microphone comprises the following: a lower insulation layer is formed on a substrate, the substrate having a vibration area, a supporting area surrounding the vibration area, and a peripheral area surrounding the supporting area; a diaphragm and an anchor for supporting the diaphragm are formed on the lower insulation layer; a sacrificial layer is formed on the lower insulation layer to cover the diaphragm and the anchor; a back plate is formed on the sacrificial layer in the vibration area to face the diaphragm; the back plate is patterned to form a plurality of acoustic holes penetrating through the back plate; and the substrate is patterned to form a cavity in the vibration area to partially expose the lower insulation layer. Further, an etching process is performed whereby an etchant is passed through the cavity and the acoustic holes to remove portions of the sacrificial layer and the lower insulation layer, each of the removed portions located at positions corresponding the vibration area and the supporting area, wherein the anchor has a repetitive concave-convex vertically-sectional shape along a direction toward a center of the diaphragm so that the anchor acts as a resistance to an acoustic wave.

In an example embodiment, forming the diaphragm and the anchor may include patterning the lower insulation layer to form anchor channels in the supporting area for forming the anchor, forming a silicon layer on the lower insulation layer through which the anchor channels are formed, and patterning the silicon layer to form the diaphragm and the anchor, wherein the anchor channels present a ring shape configured to surround the vibration area, and are spaced apart from each other.

In an example embodiment, forming the diaphragm and the anchor may include patterning the silicon layer to form a plurality of vent holes in the vibration area penetrating through the diaphragm simultaneously with the diaphragm and the anchor.

In an example embodiment, the vent holes may provide passages for an etchant during the etching process.

In an example embodiment, the method may further include forming an upper insulation layer on the sacrificial layer for holding the back plate to be spaced apart from the diaphragm prior to forming the acoustic holes and forming a strut to space the upper insulation layer from the diaphragm, wherein forming the acoustic holes comprises patterning the back plate and the upper insulation layer such that the acoustic holes penetrate through the back plate and the upper insulation layer in the vibration area.

In an example embodiment, forming the upper insulation layer and the strut may include patterning the sacrificial layer and the lower insulation layer to form a strut channel in the supporting area and along a periphery of the vibration area for forming the strut, and forming an insulation layer on the sacrificial layer to form the upper insulation layer and the strut, the insulation layer comprising a material different from those of the lower insulation layer and the sacrificial layer, and having an etching selectivity against the lower insulation layer and the sacrificial layer, such that the strut suppresses the flow of the etchant into the peripheral area while removing the portions of the lower insulation layer and the sacrificial layer in the vibration area and the supporting area.

In an example embodiment, the upper insulation layer may have a corresponding portion located over the anchor and having a concave-convex shape similar to that of the anchor.

According to example embodiments of the present invention as described above, the MEMS microphone includes the anchor for supporting the diaphragm, and the anchor may have a concave-convex shape in its vertical section. Since the anchor provides an acoustic resistance, the anchor can have the effect of a low-pass filter that blocks high frequency in the acoustic wave. As a result, since a noise component of the high frequency in the acoustic wave can be remarkably weakened as compared with the prior anchor, and the SNR of the MEMS microphone may be improved.

In addition, since the insulation layer has a corresponding portion located over the anchor and having a concave-convex shape similar to that of the anchor, the noise component of the high frequency in the acoustic wave may be further weakened as compared with conventional systems. Therefore, the SNR of the MEMS microphone may be further improved.

Further, the anchor may be provided in a ring shape extending along the periphery of the diaphragm. Accordingly, in the manufacturing process of the MEMS microphone, since the anchor may function to define the moving region of the etchant, the process margin can be secured as compared with conventional systems.

In addition, since the diaphragm has vent holes that can be provided as a passage of the acoustic wave and the etchant, the acoustic wave may smoothly move and process efficiency may be improved.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
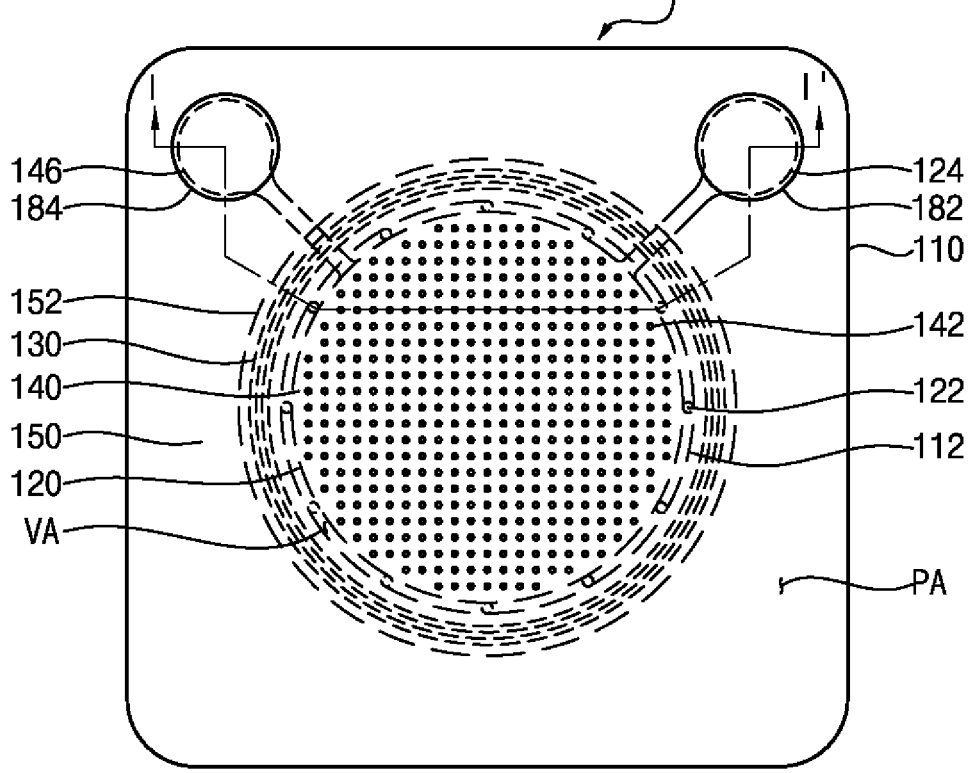
FIG. 1 is a plan view illustrating a MEMS microphone in accordance with an example embodiment of the present invention.
Figure 2:
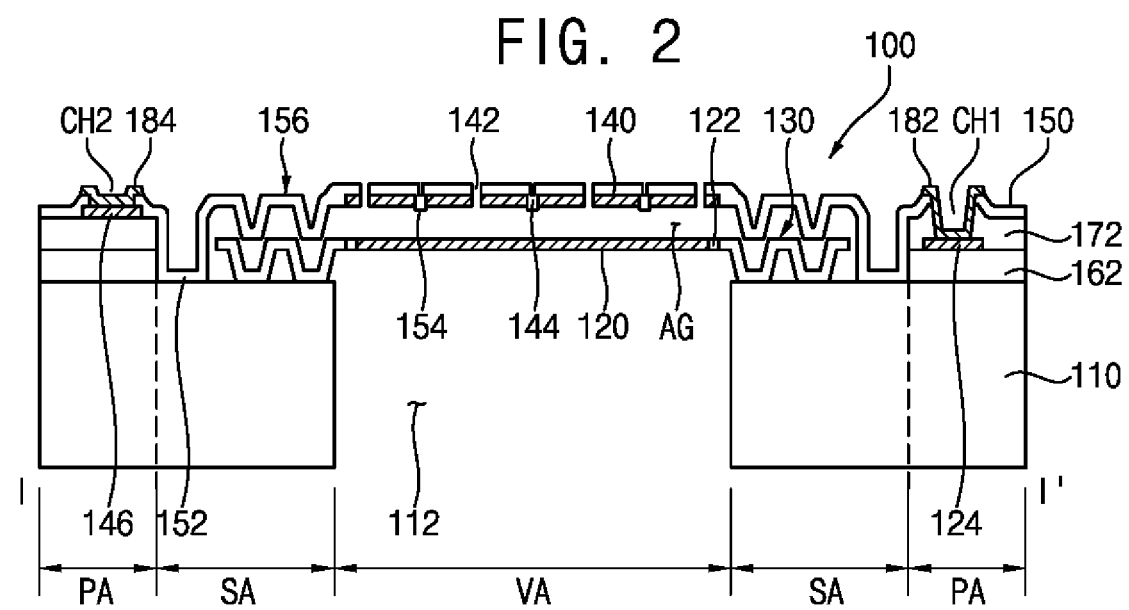
FIG. 2 is a cross sectional view taken along a line I-I' of FIG. 1.
Figure 3:
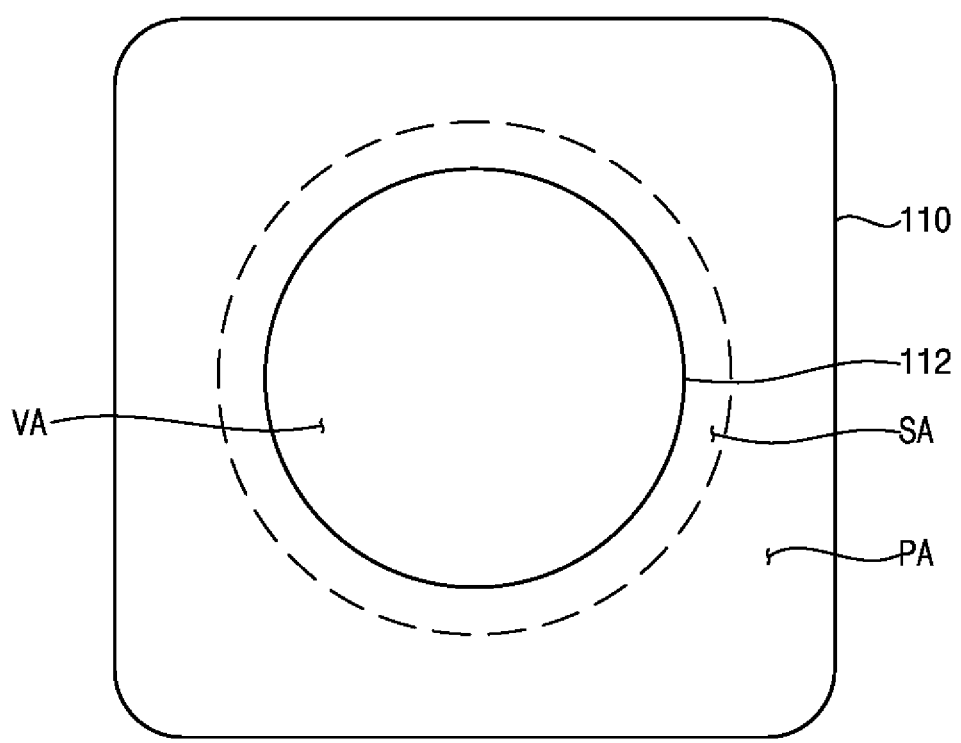
FIG. 3 is a plan view illustrating the substrate shown in FIG. 2.
Figure 4:
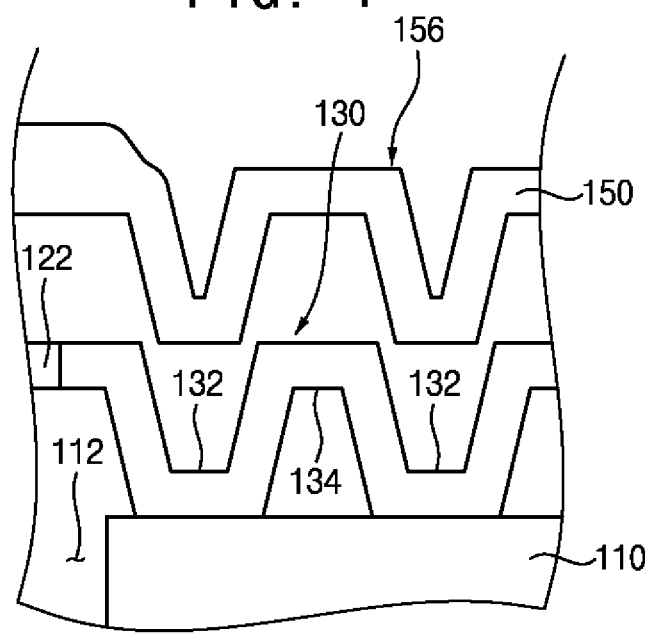
FIG. 4 is a cross sectional view illustrating a portion of the MEMS microphone of FIG. 2.

FIG. 1 is a plan view illustrating a MEMS microphone in accordance with an example embodiment of the present invention. FIG. 2 is a cross sectional view taken along a line I-I' of FIG. 1. FIG. 3 is a plan view illustrating the substrate shown in FIG. 2. FIG. 4 is a cross sectional view illustrating a portion of the MEMS microphone of FIG. 2.

Referring to FIGS. 1 to 4, a MEMS microphone 100 in accordance with an example embodiment of the present invention is capable of creating a displacement in response to an applied acoustic pressure to convert an acoustic wave into an electrical signal and output the electrical signal. The MEMS microphone 100 includes a substrate 110, a diaphragm 120, an anchor 130 and a back plate 140.

As shown in FIG. 3, the substrate 110 is divided into a vibration area VA, a supporting area SA surrounding the vibration area VA, and a peripheral area PA surrounding the supporting area SA. In the vibration area VA of the substrate 110, a cavity 112 is formed to provide a space into which the diaphragm 120 is bendable due to the acoustic pressure. The cavity 112 is defined by a cavity wall.

In an example embodiment, the cavity 112 may have a cylindrical shape. Further, the cavity 112 may be formed in the vibration area VA to have a shape and a size corresponding to those of the vibration area VA.

The diaphragm 120 may be disposed over the substrate 110. The diaphragm may generate a displacement which may occur due to the acoustic pressure. The diaphragm 120 may have a membrane structure. The diaphragm 120 may cover the cavity 112. The diaphragm 120 may have a lower surface that is exposed to the cavity 112. The diaphragm 120 is bendable in response to applied acoustic pressure, and the diaphragm 120 is spaced apart from the substrate 110.

As shown in FIG. 2, the diaphragm 120 may have a doped portion which is doped with impurities through an ion implantation process. The doped portion may be positioned to correspond to the back plate 140.

In an example embodiment, the diaphragm 120 may have a shape of a circular disc, as shown in FIG. 1.

The anchor 130 is positioned at an end portion of the diaphragm 120. The anchor 130 is positioned in the supporting area SA of the substrate 110. The anchor 130 supports the diaphragm 120. As shown in FIG. 1, the anchor 130 may extend from a periphery of the diaphragm 120 toward the substrate 110 to space the diaphragm 120 from the substrate 110.

In an example embodiment of the present invention, the anchor 130 may be integrally formed with the diaphragm 120. The anchor 130 may have the lower surface to make contact with the upper surface of the substrate 110.

In an example embodiment of the present invention, the anchor 130 may have a ring shape and may surround the cavity 112, as shown FIG. 1.

The anchor 130 may have a repetitive concave-convex vertically-sectional shape along a direction toward a center of the diaphragm 120.

In particular, the anchor 130 includes a plurality of contacting portions 132 in contact with the upper surface of the substrate 110, and a connecting portion 134 connecting the contacting portions 110 to each other.

The contacting portions 132 may be in contact with the substrate 110 and may have a ring shape, surrounding the cavity 112 proximate the upper surface of the substrate 110. The contacting portions 132 may be spaced from each other. Each of the contacting portions 132 may have a U-shaped vertical section.

The contact portion 132 positioned adjacent to the cavity 112 may be connected to the diaphragm 120 to support the diaphragm 120.

The connecting portion 134 is disposed between the contacting portions 132, and connects the contacting portions 110 to each other. The connecting portion 134 may have a ring shape to surround the cavity 112. The connecting portion 134 may have a linear-shaped vertical section.

In an example embodiment of the present invention, when three or more contacting portions 132 are provided, a plurality of the connection portions 132 may be provided.

According to example embodiments, since the anchor 130 may have the repetitive concave-convex shape in its vertical section, the anchor 130 provides acoustic resistance. In particular, the concave-convex shape of the anchor 130 may act as a low-pass filter that blocks high frequency components of the acoustic wave. Since a high frequency noise component in the acoustic wave can be remarkably weakened as compared with the prior anchor, signal-to-noise ratio (SNR) of the MEMS microphone may be increased.

In the anchor 130, widths of the contacting portions 132 and the connection portion 134 may be the same or different from each other. Strength of the acoustic resistance of the anchor 130 can be adjusted by adjusting the widths of the contacting portions 132 and the connection portion 134. Therefore, a degree of improvement of the SNR of the MEMS microphone 100 may be adjusted.

In addition, the diaphragm 120 may have a plurality of vent holes 122. As shown in FIG. 1, the vent holes 122 may be arranged along the anchor 130 in a ring shape and may be spaced apart from one another. The vent holes 122 are formed by penetrating through the diaphragm 120 in a vertical direction, and are located about a circle having a diameter smaller than the inner diameter of the anchor 130 (i.e., positions inside of the anchor 130 in a horizontal direction). As shown in FIG. 2, the vent holes 122 are positioned in the vibration area VA. Each of the vent holes 122 may serve as a passage for the applied acoustic wave. Further, each of the vent holes 122 may also function as a passage for the etchant to be used in the process of manufacturing the MEMS microphone 100.

The vent holes 122 may be positioned in the vibration area VA. Alternatively, the vent holes 122 may be positioned in a boundary region between the vibration region VA and the supporting region SA or in the supporting region SA adjacent to the vibration region VA.

The back plate 140 may be disposed over the diaphragm 120. The back plate 140 may be disposed in the vibration area VA to face the diaphragm 120. The back plate 140 may have a doped portion which is formed by doping impurities through an ion implantation process. The back plate 140 may have a shape of a circular disc in embodiments.

In an example embodiment, the MEMS microphone 100 may further include an upper insulation layer 150 and a strut 152 for holding the back plate 140 apart from the substrate 110.

In embodiments, the upper insulation layer 150 is positioned over the substrate 110 over which the back plate 140 is positioned. The upper insulation layer 150 may cover the back plate 140 to hold the back plate 140. Thus, the upper insulation layer 150 may space the back plate 140 from the diaphragm 120.

As shown in FIG. 2, the back plate 140 and the upper insulation layer 150 are spaced apart from the diaphragm 120 to make the diaphragm 120 freely bendable in response to an applied acoustic pressure. Further, an air gap AG is formed between the diaphragm 120 and the back plate 140.

A plurality of acoustic holes 142 may be formed through the back plate 140 such that the acoustic wave may flow or pass through the acoustic holes 142. The acoustic holes 142 may be formed through the upper insulation layer 150 and the back plate 140 to communicate with the air gap AG.

The back plate 140 may include a plurality of dimple holes 144. Further, a plurality of dimples 154 may be positioned in the dimple holes 144. The dimple holes 144 may be formed through the back plate 140. The dimples 154 may be positioned to correspond to positions at which the dimple holes 144 are formed.

The dimples 154 may prevent the diaphragm 120 from being coupled to a lower face of the back plate 140, inhibiting a known issue of conventional MEMS microphones. When acoustic pressure is applied to the diaphragm 120, the diaphragm 120 can be bent in a generally semispherical or paraboloid shape toward the back plate 140, and then can return to its initial position. The degree of bending of the diaphragm 120 may vary depending on a magnitude of the applied acoustic pressure and may be increased to such an extent that an upper surface of the diaphragm 120 makes contact with the lower surface of the back plate 140. If the diaphragm 120 is bent so much as to contact the back plate 140, the diaphragm 120 may attach to the back plate 140 and may not return to the initial position. According to example embodiments, the dimples 154 may protrude from the lower surface of the back plate 140 toward the diaphragm 120. Even when the diaphragm 120 is so deformed that the diaphragm 120 contacts the back plate 140, the dimples 154 may keep the diaphragm 120 and the back plate 140 sufficiently separated from each other that the diaphragm 120 is able to return to the initial position.

The strut 152 may be positioned in the supporting area SA and near the boundary between the supporting area SA and the peripheral area PA. The strut 152 may support the upper insulation layer 150 to space the upper insulation layer 150 and the back plate 140 from the diaphragm 120. The strut 152 may extend from a periphery of the upper insulation layer 150 toward the substrate 110. As shown in FIG. 2, the strut 152 may include a lower surface in contact with the lower surface of the substrate 110.

In an example embodiment, the strut 152 may be integrally formed with the upper insulation layer 150. The strut 152 may have a U-shaped vertical section, as shown in FIG. 2.

The strut 152 may be spaced in a radial direction from the diaphragm 120 and may be outwardly positioned away from the anchor 130. The strut 152 may have a ring shape to surround the diaphragm 120, as shown in FIG. 1.

The upper insulation layer 150 may have a corresponding portion 156, which is located over the anchor 130 and has a concave-convex shape. In particular, the corresponding portion 156 may have the concave-convex shape similar to that of the anchor 130. Since the upper insulation layer 150 is deposited, above a previously formed anchor 130, the corresponding portion 156 of the upper insulation layer 150 may be formed in the concave-convex shape similar to that of the anchor 130.

The anchor 130 and the corresponding portion 156 of the upper insulation layer 150 are arranged in a vertical direction and have the repetitive concave-convex shape, respectively. Thus, the anchor 130 and the corresponding portion 156 may greatly act as an acoustic resistance, and effects of the low pass filter in the anchor 130 and the corresponding portion 156 may be increased. The anchor 130 and the corresponding portion 156 may further weaken the high frequency noise component in the acoustic wave and further improve the SNR of the MEMS microphone 100.

In an example embodiment, the MEMS microphone 100 may further include a lower insulation layer pattern 162, a diaphragm pad 124, a sacrificial layer pattern 172, a back plate pad 146, a first pad electrode 182 and a second pad electrode 184.

In particular, the lower insulation layer pattern 162 may be disposed on the upper surface of the substrate 110 and under the upper insulation layer 150.

The diaphragm pad 124 may be formed on an upper surface of the lower insulation layer pattern 162. The diaphragm pad 124 may be located in the peripheral region PA. The diaphragm pad 124 may be electrically connected to the diaphragm 120 and may be doped with impurities. Though not shown in detail in figures, a connection portion may be doped with impurities to connect the doped portion of the diaphragm 120 to the diaphragm pad 124.

The sacrificial layer pattern 172 may be formed on the lower insulation layer pattern 162 on which the diaphragm pad 124 is formed, and under the upper insulation layer 150. As shown in FIG. 2, the lower insulation layer pattern 162 and the sacrificial layer pattern 172 are located in the peripheral region PA, and are disposed outside of the outer perimeter of the strut 152. Further, the lower insulation layer pattern 162 and the sacrificial layer pattern 172 may be formed using a material different from that of the upper insulation layer 150.

The back plate pad 146 may be formed on an upper face of the sacrificial layer pattern 172. The back plate pad 146 may be located in the peripheral region PA. The back plate pad 146 may be electrically connected to the back plate 140 and may be doped with impurities by an ion implantation process. Though not shown in detail in figures, a connection portion may be doped with impurities to connect the back plate 140 to the back plate pad 146.

The first and second pad electrodes 182 and 184 may be disposed on the upper insulation layer 150 and in the peripheral area PA. The first pad electrode 182 is located over the diaphragm pad 124 to make contact with the diaphragm pad 124. On the other hand, the second pad electrode 184 is located over the back plate pad 146 to make contact with the back plate pad 146. As shown in FIG. 2, a first contact hole CH1 is formed by penetrating through the upper insulation layer 150 and the sacrificial layer pattern 172 to expose the diaphragm pad 124, and the first pad electrode 182 makes contact with the diaphragm pad 124 exposed by the first contact hole CH1. Further, a second contact hole CH2 is formed by penetrating through the upper insulation layer 150 to expose the back plate pad 146, and the second pad electrode 184 is formed in the second contact hole CH2 to make contact with the back plate pad 146 exposed by the second contact hole CH2.

As described above, the MEMS microphone 100 according to example embodiments of the present invention includes the anchor 130 having an alternating concave-convex shape, so that a noise component of the high frequency in the acoustic wave may be remarkably weakened, as compared to conventional MEMS microphones. Thus, the SNR of the MEMS microphone may be improved compared to those conventional MEMS microphones.

In addition, since the upper insulation layer 150 has the corresponding portion 156 located over the anchor 130 and having a concave-convex shape similar to that of the anchor 130, the noise component of the high frequency in the acoustic wave may be further weakened as compared with the conventional systems. Therefore, the SNR of the MEMS microphone 100 may be further improved.

Further, the anchor 130 may be provided in a ring shape extending along the periphery of the diaphragm 120. Accordingly, in the manufacturing process of the MEMS microphone 100, since the anchor 130 may function to define the moving region of the etchant, the process margin can be secured as compared with conventional systems.

In addition, since the diaphragm 120 has vent holes 122 that can be provided as a passage of the acoustic wave and the etchant, the acoustic wave may smoothly move and process efficiency may be improved.

Hereinafter, a method of manufacturing a MEMS microphone will be described in detail with reference to the drawings.

Figure 5:
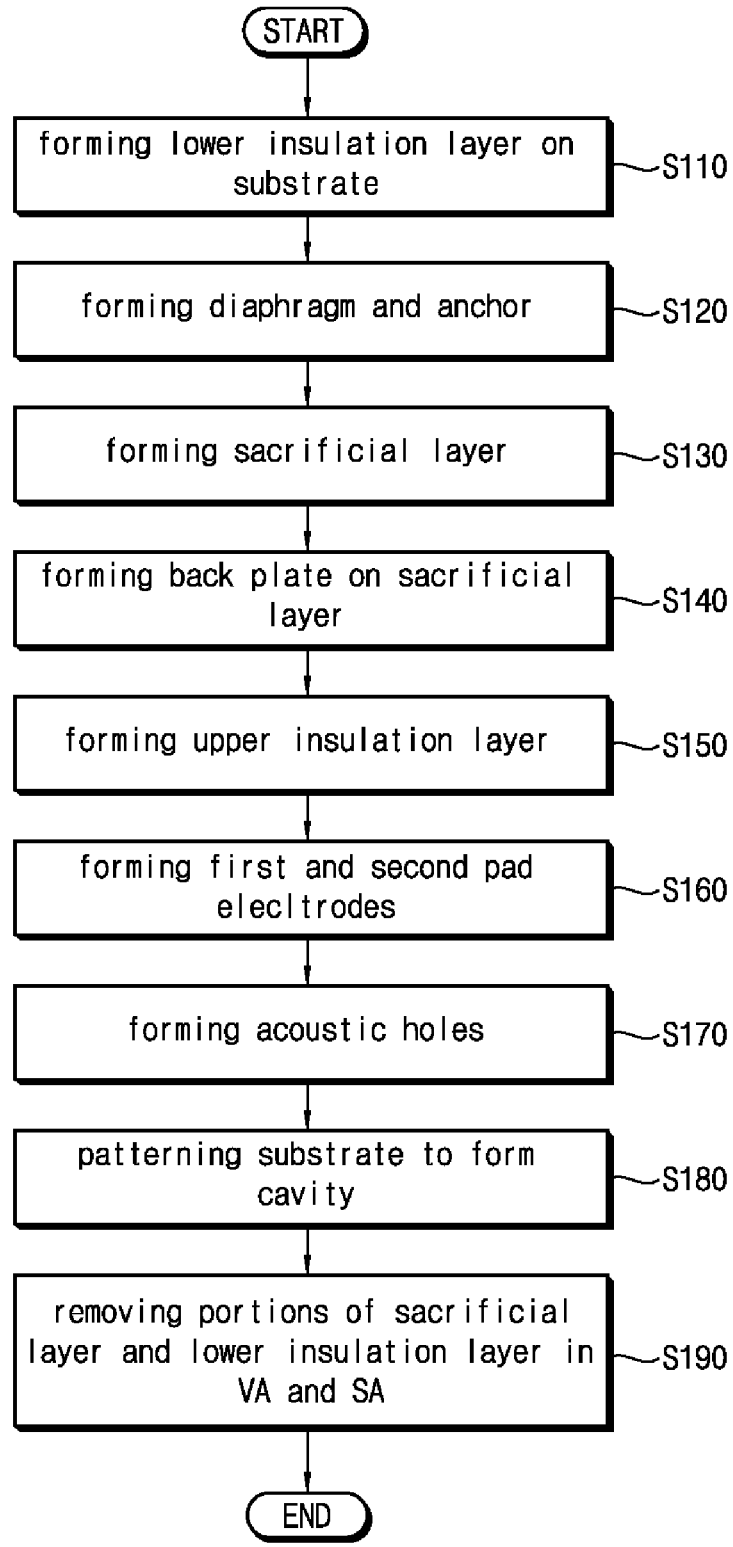
FIG. 5 is a flow chart illustrating a method of manufacturing a MEMS microphone in accordance with an example embodiment of the present invention.

FIG. 5 is a flow chart illustrating a method of manufacturing a MEMS microphone in accordance with an example embodiment of the present invention. FIGS. 6, 8 to 17 are cross sectional views illustrating a method of manufacturing a MEMS microphone in accordance with an example embodiment of the present invention, and FIG. 7 is a plan view illustrating the lower insulation layer pattern of FIG. 6.

Referring to FIGS. 5 to 9, according to example embodiments of a method for manufacturing a MEMS microphone, a lower insulation layer 160 is formed on a substrate 110 at S110.

Then, a diaphragm 120 and an anchor 130 are formed on the lower insulation layer 160 at S120.

Hereinafter, S120 (forming the diaphragm 120 and the anchor 130) will be in explained in further detail.

Figure 6:
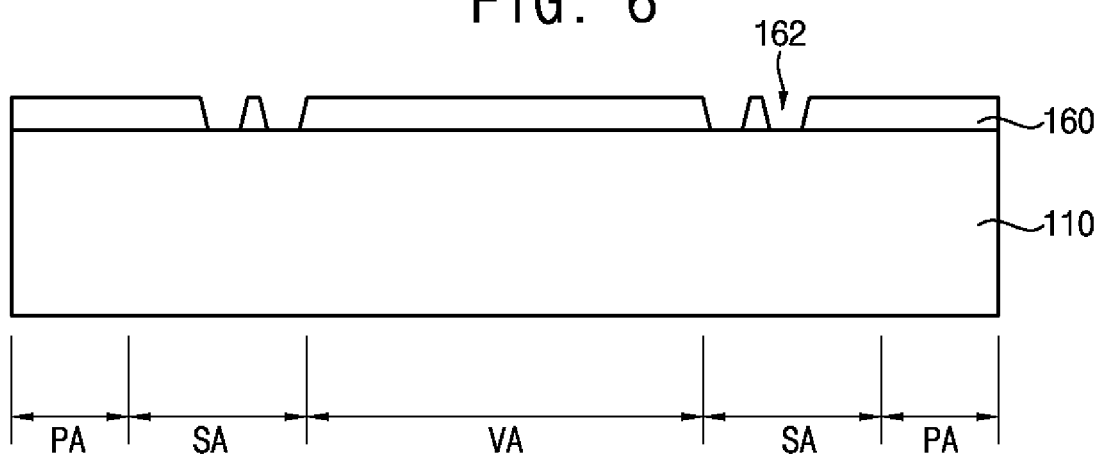
FIGS. 6, 8 to 17 are cross sectional views illustrating a method of manufacturing a MEMS microphone in accordance with an example embodiment of the present invention.
Figure 7:
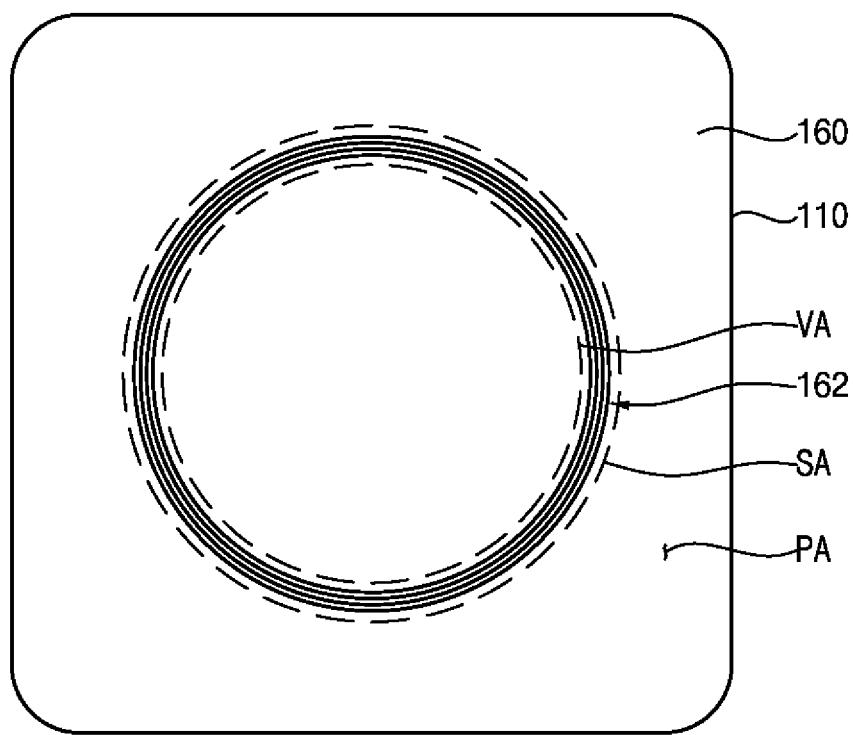
FIG. 7 is a plan view illustrating a lower insulation layer pattern in FIG. 6.

The lower insulation layer 160 is patterned to form anchor channels 162 for forming the anchor 130, as depicted in FIG. 6. The anchor channels 162 may partially expose the substrate 110. The anchor channels 162 may be formed in the supporting area SA. For example, each of the anchor channels 162 may be formed to have a ring shape to surround the vibration area VA, as shown in FIG. 7. The anchor channels 162 are provided in a plurality and may be spaced from each other in a concentric manner. The anchor channels 162 may have an alternating concave-convex shape which corresponds to that of the anchor to be formed in a subsequent process.

Figure 8:
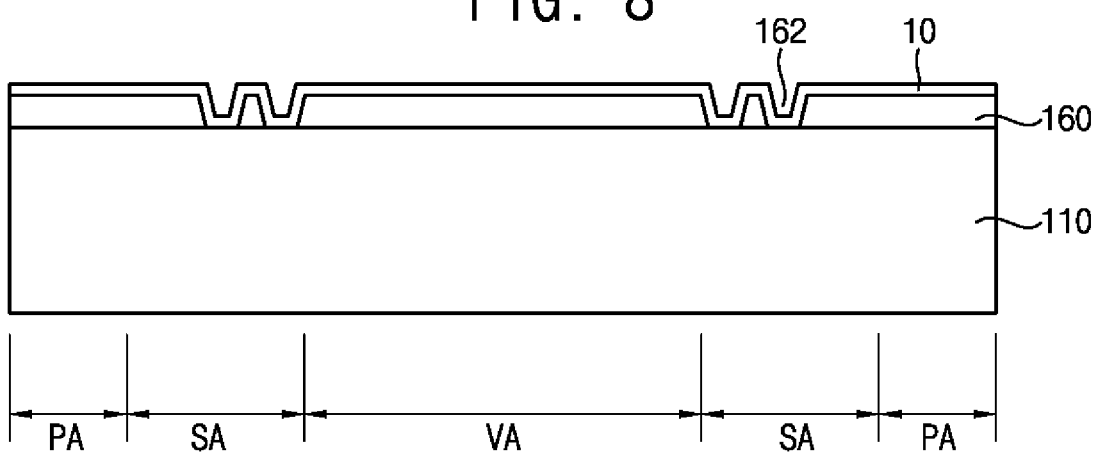

Next, as shown in FIG. 8, a first silicon layer 10 is formed on the lower insulation layer 160 on which the anchor channels 162 are formed. The first silicon layer 10 may be formed using polysilicon.

Impurities may be doped into both a portion of the first silicon layer 10 positioned in the vibration region VA and a portion of the first silicon layer 10 to be subsequently transformed into a diaphragm pad 124 through an ion implantation process.

Figure 9:
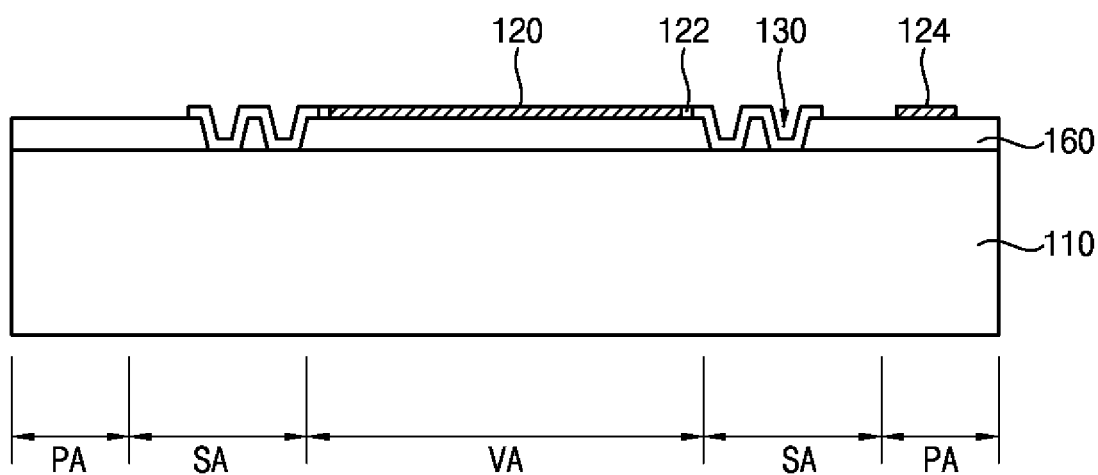

Then, the first silicon layer 10 is patterned to form a diaphragm 120 and the anchor 130, and the diaphragm pad 124 is formed in the peripheral area PA, as shown in FIG. 9. The anchor 130 is formed along a circumference of the diaphragm 120 in the supporting region SA. The anchor 130 may have a repetitive concave-convex shape along a direction toward a center of the diaphragm 120 so that the anchor 130 acts as a resistance to the acoustic wave. As shown in FIG. 4, the anchor 130 may include the contacting portions 132 and the connecting portion 134 so that the anchor 130 has the repetitive concave-convex shape in its vertical section.

Further, a plurality of vent holes 122 may be formed to penetrate through the diaphragm 120 as well. The vent holes 122 may be poisoned in the vibration area VA.

Figure 10:
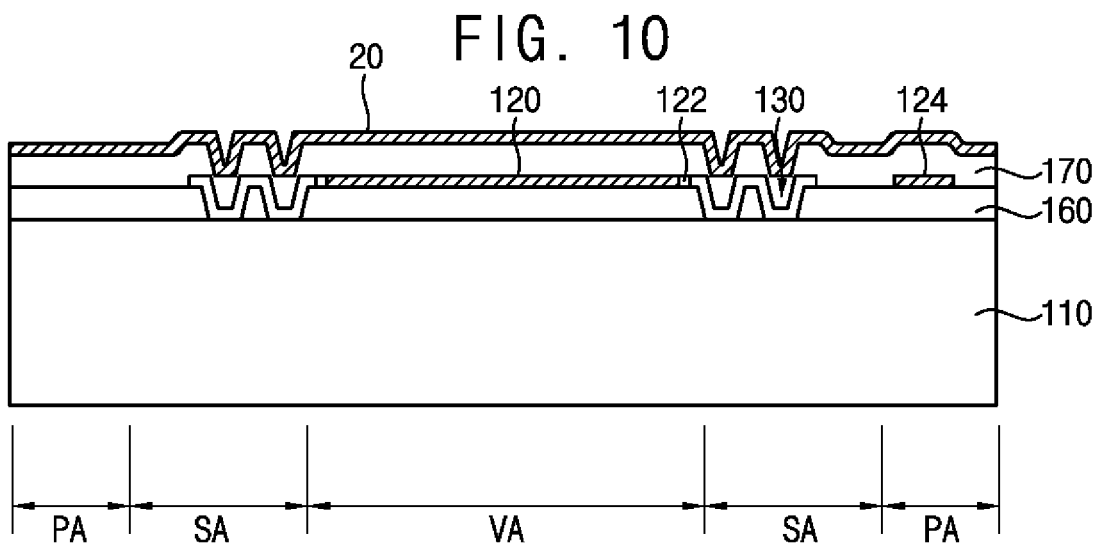

Referring to FIGS. 5 and 10, a sacrificial layer 170 is formed on the lower insulation layer 160 to cover the diaphragm 120 and the diaphragm pad 124 at S130.

Figure 11:
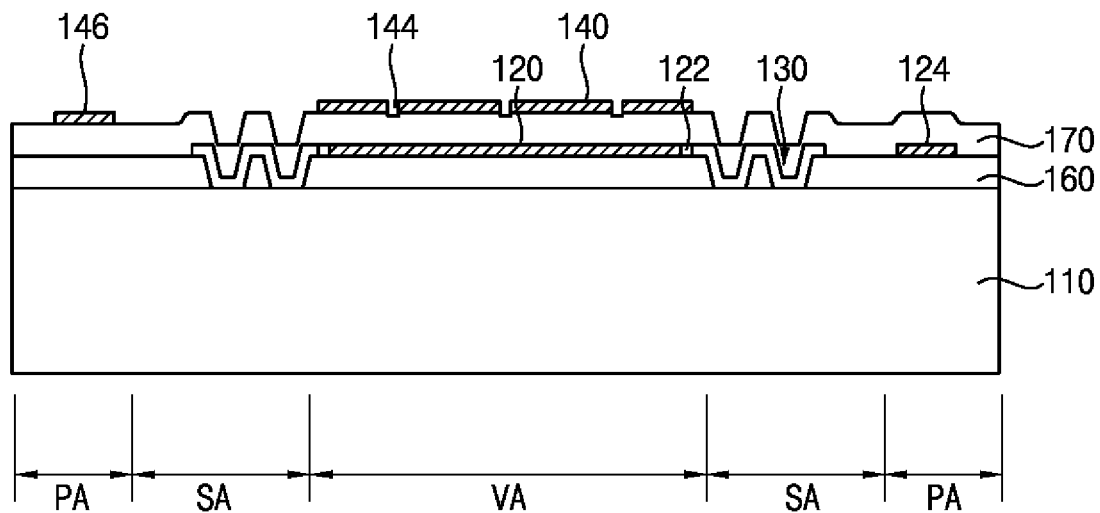

Referring to FIGS. 5 and 11, a back plate 140 is formed on the sacrificial layer 170 at S140.

In particular, a second silicon layer 20 is formed on an upper surface of the sacrificial layer 170. Then, impurities are doped with the second silicon layer 20 by an ion implantation process. In an example embodiment, the second silicon layer 20 may be formed using polysilicon.

Next, as shown in FIG. 11, the second silicon layer 20 is patterned to form a back plate 140 and a back plate pad 146. Further, when forming the back plate 140, dimple holes 144 for forming dimples 154 (see FIG. 2) may be further formed, whereas acoustic holes 142 (see FIG. 2) may not be formed. A portion of the sacrificial layer 170 corresponding to the dimple holes 144 may be etched to cause the dimples 154 to protrude downwardly from a lower surface of the back plate 140.

Figure 12:
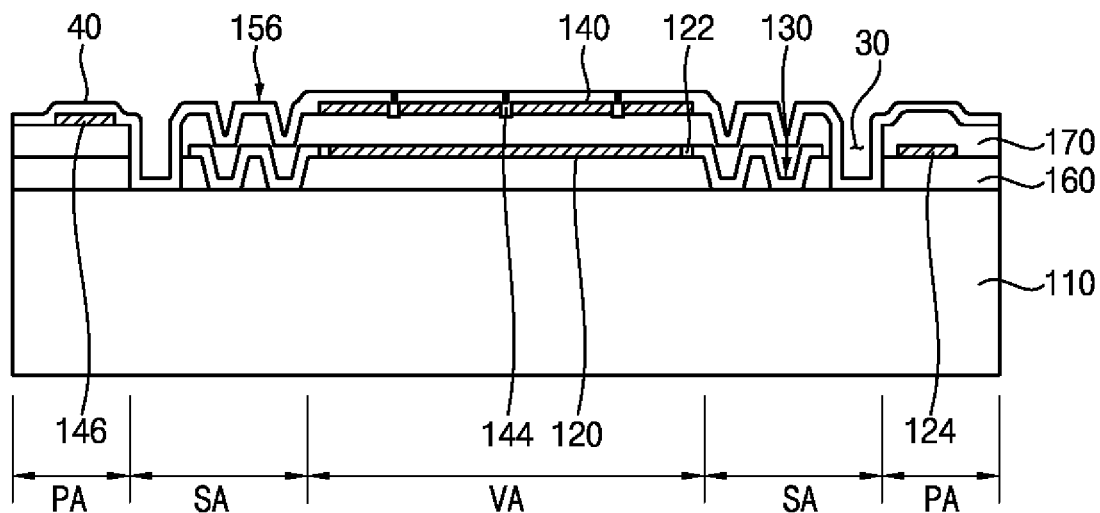
Figure 13:
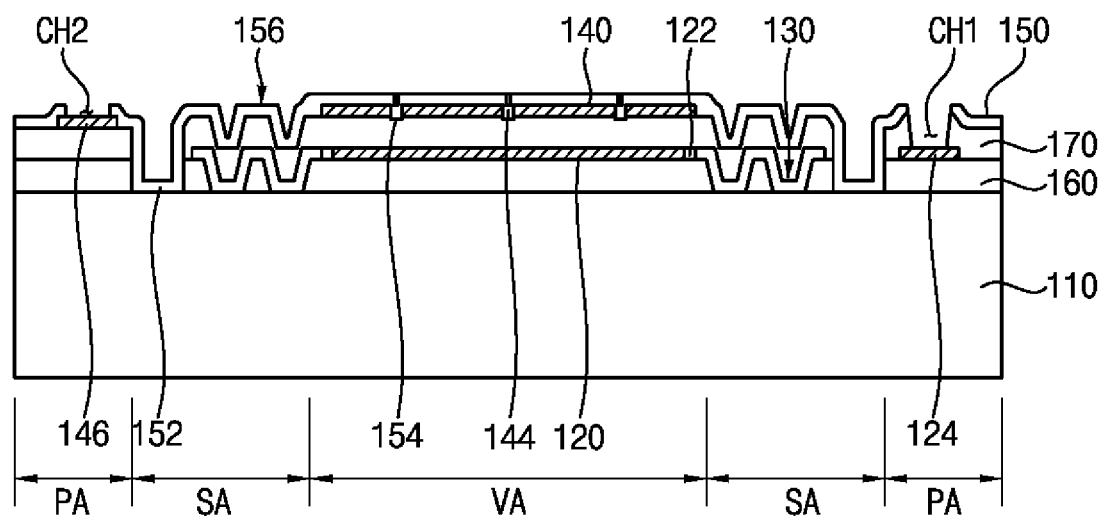

Referring to FIGS. 5, 12 and 13, an upper insulation layer 150 and a strut 152 are formed on the sacrificial layer 170 on which the back plate 140 is formed at S150.

In particular, the sacrificial layer 170 and the lower insulation layer 160 are patterned to form a strut channel 30 in the supporting area SA for forming a strut 152. The strut channel 30 may partially expose the supporting area SA of the substrate 110. Even though not shown in detail, the strut channel 30 may have a ring shape to surround the diaphragm 120.

After an insulation layer 40 is formed on the sacrificial layer 170 having the strut channel 30, the insulation layer 40 is patterned to form an upper insulation layer 150 and the strut 152, as shown in FIG. 13. Further, the dimples 154 may be further formed in the dimple holes 144 and a second contact hole CH2 is formed to expose the back plate pad 146. Furthermore, both a portion of the insulation layer 40 and a portion of the sacrificial layer 170, positioned over the diaphragm pad 124, are removed to form a first contact hole CH1.

The upper insulation layer 150 may have a corresponding portion 156, which is located over the anchor 130, and the corresponding portion 156 has a concave-convex shape. In particular, the corresponding portion 156 may have the concave-convex shape similar to that of the anchor 130. Since the upper insulation layer 150 is deposited above a previously formed anchor 130, the corresponding portion 156 of the upper insulation layer 150 may be formed in the concave-convex shape similar to that of the anchor 130.

In an example embodiment, the insulation layer 40 may be formed using a material different from those of the lower insulation layer 160 and the sacrificial layer 170. In one example embodiment, the insulation layer 40 is formed using silicon nitride or silicon oxynitride, whereas the lower insulation layer 160 and the sacrificial layer 170 are formed using silicon oxide.

Figure 14:
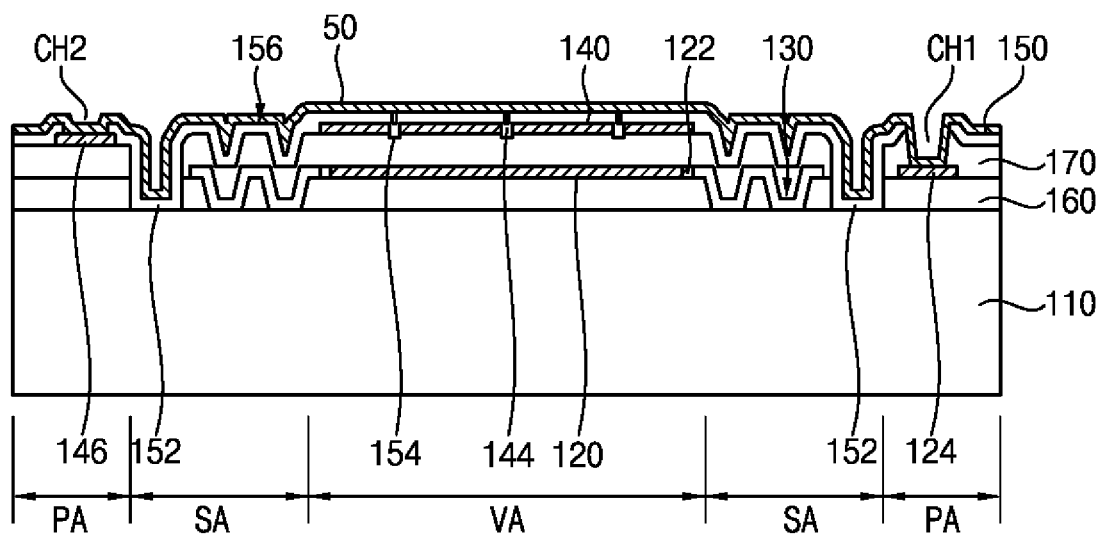
Figure 15:
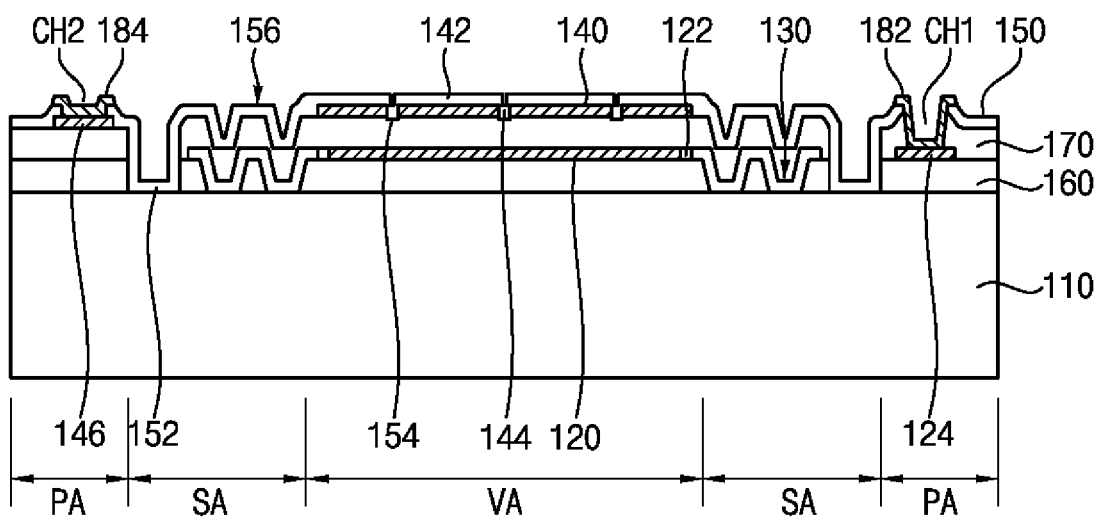

Referring to FIGS. 5, 14 and 15, after forming the first and the second contact holes CH1 and CH2, a first pad electrode 182 and a second pad electrode 184 may be formed in the peripheral area PA at S160.

A thin film 50 is formed on the upper insulation layer 150 through which the first and the second contact holes CH1 and CH2 are formed, as shown in FIG. 14. In an example embodiment, the thin film 50 may be formed using a conductive metal such as aluminum.

Next, the thin film 50 is patterned to form a first pad electrode 182 and a second pad electrode 172, as shown in FIG. 15.

Figure 16:
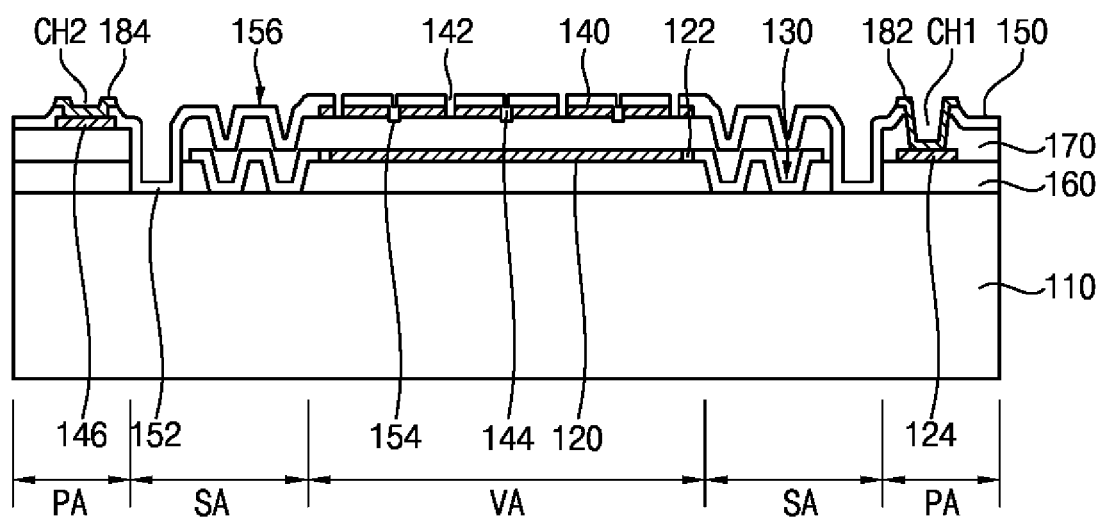

Referring to FIGS. 5 and 16, the upper insulation layer 150 and the back plate 140 are patterned to form acoustic holes 142 in the vibration area VA at S170.

Figure 17:
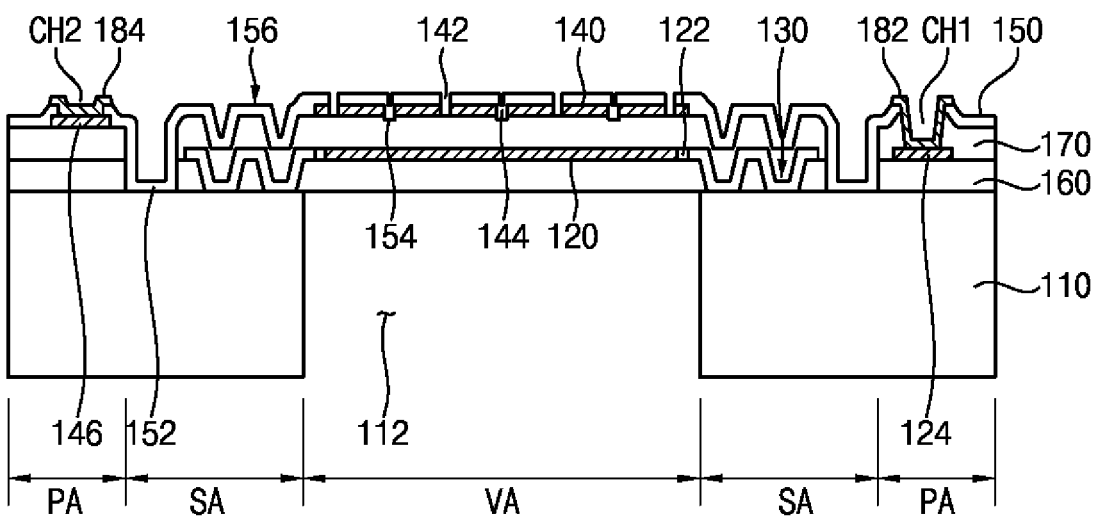

Referring to FIGS. 2, 5, and 17, after forming the acoustic holes 142, the substrate 110 is patterned to form a cavity 112 in the vibration area VA at S180. Thus, a portion of the lower insulation layer 160 is exposed through the cavity 112.

Portions of the sacrificial layer 170 and the lower insulation layer 160, corresponding to the vibration area VA and the supporting area SA, are removed through an etching process using the cavity 112, the acoustic holes 142, and the vent holes 122 at S190. Thus, the diaphragm 120 is exposed through the cavity 112, and an air gap AG is formed. Further, the sacrificial layer pattern 172 and the lower insulation layer pattern 162 are formed. As a result, the MEMS microphone 100 as shown in FIG. 2 is manufactured using the cavity 112, the acoustic holes 142, and the vent holes 122 may also act as passages of etchant for partially removing the lower insulating layer 160 and the sacrificial layer 170.

In addition, the anchor 130 and strut 152 may function to restrict the flow of the etchant during the removal of the sacrificial layer 170 and the lower insulation layer 160 from the vibration region VA and the support region SA. Therefore, an etching amount of the sacrificial layer 170 and the lower insulation layer 160 may be adjusted to prevent the lower insulation layer 160 from remaining inside of the anchor 130.

In an example embodiment of the present invention, a hydrogen fluoride vapor (HF vapor) may be used as the etchant for removing the sacrificial layer 170 and the lower insulation layer 160.

As described above, according to the methods of manufacturing a MEMS microphone of the present invention, the anchor 130 may extend along a periphery of the diaphragm 120 to have a ring shape. Thus, while performing the method of manufacturing the MEMS microphone 100, the anchor 130 may function to restrict a flow area in which etchant flows. As a result, the process margin can be secured and the lower insulation layer 160 may be prevented from remaining inside of the anchor 130. Therefore, the MEMS microphone 100 can prevent the buckling phenomenon of the diaphragm 120, which may occur due to a residual insulation material, and can make the acoustic wave move smoothly. In addition, the process efficiency may be improved.

In addition, since the etchant may be moved through the vent holes 122 of the diaphragm 120 during the manufacturing process of the MEMS microphone, the process efficiency can be improved.

Further, the anchor 130 and the corresponding portion 156 located over the anchor 130 in the upper insulation layer 150 have the alternating or repetitive concave-convex shape, respectively, so that the noise component of the high frequency in the acoustic wave may be remarkably weakened, as comparing with conventional systems. Thus, the SNR of the MEMS microphone 100 may be improved compared to those conventional systems.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A Micro-Electro-Mechanical Systems (MEMS) microphone comprising:
   a substrate defining a cavity;
   a diaphragm spaced apart from the substrate, covering the cavity, and configured to generate a displacement thereof in response to an applied acoustic pressure;
   an anchor extending from an end portion of the diaphragm and fixed to an upper surface of the substrate to support the diaphragm; and
   a back plate disposed over the diaphragm, the back plate being spaced apart from the diaphragm such that an air gap is maintained between the back plate and the diaphragm, the back plate defining a plurality of acoustic holes,
   wherein the anchor has a repetitive concave-convex vertically-sectional shape along a direction toward a center of the diaphragm so that the anchor acts as a resistance element to any acoustic wave that passes into the cavity in response to the applied acoustic pressure.

2. The MEMS microphone of claim 1, wherein the anchor includes a plurality of contacting portions in contact with the upper surface of the substrate, the plurality of contacting portions spaced from each other and, in aggregate, presenting a ring shape having an inner diameter larger than the perimeter of the cavity.

3. The MEMS microphone of claim 2, wherein the anchor further includes a connecting portion disposed between the contacting portions to connect the contacting portions to each other.

4. The MEMS microphone of claim 3, wherein at least one of a width of the contacting portions or a width of the connecting portion is set to define an acoustic resistance value of the anchor with respect to the acoustic wave that passes into the cavity in response to the applied acoustic pressure.

5. The MEMS microphone of claim 2, wherein the diaphragm defines a plurality of vent holes penetrating therethrough, and spaced apart from each other along an edge portion of the diaphragm.

6. The MEMS microphone of claim 1, further comprising:
   an upper insulation layer covering the back plate and configured to hold the back plate at a distance from the diaphragm such that the air gap is maintained; and
   a strut provided at an outer side of the anchor and having a lower surface in contact with the upper surface of the substrate to support the upper insulation layer away from the substrate such that the upper insulation layer is spaced apart from the diaphragm.

7. The MEMS microphone of claim 6, wherein the upper insulation layer has a corresponding portion located over the anchor and having a concave-convex shape corresponding to that of the anchor.

8. A MEMS microphone comprising:
   a substrate presenting a vibration area, a supporting area surrounding the vibration area and a peripheral area surrounding the supporting area, the substrate defining a cavity formed in the vibration area;
   a diaphragm disposed in the vibration area, being spaced apart from the substrate, covering the cavity, and configured to generate a displacement thereof in response to an applied acoustic pressure;
   an anchor extending from an end portion of the diaphragm, the anchor arranged in the supporting area and fixed to an upper surface of the substrate to support the diaphragm; and
   a back plate disposed over the diaphragm in the vibration area, the back plate being spaced apart from the diaphragm to maintain an air gap between the back plate and the diaphragm, the back plate defining a plurality of acoustic holes,
   wherein the anchor has a repetitive concave-convex vertically-sectional shape along a direction toward a center of the diaphragm so that the anchor acts as a resistance element to any acoustic wave that passes into the cavity in response to the applied acoustic pressure.

9. The MEMS microphone of claim 8, wherein the anchor includes:
   a plurality of contacting portions in contact with the upper surface of the substrate, wherein the plurality contacting portions are spaced apart from each other and, in aggregate, present a ring shape having an inner diameter larger than the perimeter of the cavity; and
   a connecting portion disposed between the contacting portions to connect the plurality of contacting portions to each other.

10. The MEMS microphone of claim 9, wherein at least one of width of the contacting portions or a width of the connecting portion is set to define an acoustic resistance value of the anchor with respect to the acoustic wave that passes into the cavity in response to the applied acoustic pressure.

11. The MEMS microphone of claim 8, wherein the diaphragm defines a plurality of vent holes penetrating therethrough, spaced apart from each other along an edge portion of the diaphragm and located in the vibration area.

12. The MEMS microphone of claim 8, further comprising:
   an upper insulation layer covering the back plate and holding the back plate to space the back plate from the diaphragm such that the air gap is maintained; and
   a strut disposed in the supporting area and having a lower surface in contact with the upper surface of the substrate to support the upper insulation layer away from the substrate such that the upper insulation layer is spaced apart from the diaphragm.

13. The MEMS microphone of claim 12, wherein the upper insulation layer has a corresponding portion located over the anchor and having a concave-convex shape corresponding to that of the anchor.

14. A method of manufacturing a MEMS microphone, comprising:

forming a lower insulation layer on a substrate, the substrate having a vibration area, a supporting area surrounding the vibration area, and a peripheral area surrounding the supporting area;

forming a diaphragm and an anchor supporting the diaphragm on the lower insulation layer;

forming a sacrificial layer on the lower insulation layer covering the diaphragm and the anchor;

forming a back plate on the sacrificial layer in the vibration area facing the diaphragm;

patterning the back plate to form a plurality of acoustic holes penetrating through the back plate;

patterning the substrate to form a cavity in the vibration area to partially expose the lower insulation layer; and performing an etching process whereby an etchant is passed through the cavity and the acoustic holes to remove portions of the sacrificial layer and the lower insulation layer, each of the removed portions located at positions corresponding the vibration area and the supporting area, wherein the anchor has a repetitive concave-convex vertically-sectional shape along a direction toward a center of the diaphragm so that the anchor acts as a resistance element to any acoustic wave that passes into the cavity in response to the applied acoustic pressure.

15. The method of claim 14, wherein forming the diaphragm and the anchor comprises:

patterning the lower insulation layer to form a plurality of anchor channels in the supporting area for forming the anchor;

forming a silicon layer on the lower insulation layer through which the anchor channels are formed; and patterning the silicon layer to form the diaphragm and the anchor, wherein the plurality of anchor channels present a ring shape configured to surround the vibration area, and are spaced apart from each other.

16. The method of claim 15, wherein forming the diaphragm and the anchor includes patterning the silicon layer to form a plurality of vent holes in the vibration area penetrating through the diaphragm simultaneously with the diaphragm and the anchor.

17. The method of claim 16, wherein the vent holes provide passage for an etchant during the etching process.

18. The method of claim 14, further comprising:

forming an upper insulation layer on the sacrificial layer configured to hold the back plate apart from the diaphragm prior to forming the acoustic holes; and forming a strut to space the upper insulation layer from the diaphragm, wherein forming the acoustic holes comprises patterning the back plate and the upper insulation layer such that the acoustic holes penetrate through the back plate and the upper insulation layer in the vibration area.

19. The method of claim 18, wherein forming the upper insulation layer and the strut comprises:

patterning the sacrificial layer and the lower insulation layer to form a strut channel in the supporting area and along a periphery of the vibration area for forming the strut; and forming an insulation layer on the sacrificial layer to form the upper insulation layer and the strut, the insulation layer comprising a material different from those of the lower insulation layer and the sacrificial layer, and having an etching selectivity against the lower insulation layer and the sacrificial layer, such that the strut suppresses the flow of the etchant into the peripheral area while removing the portions of the lower insulation layer and the sacrificial layer in the vibration area and the supporting area.

20. The method of claim 19, wherein the upper insulation layer has a corresponding portion located over the anchor and having a concave-convex shape similar to that of the anchor.

* * * * *